（12）United States Patent
Stoner et al.

(10) Patent No.: US 9,338,904 B2
(45) Date of Patent: May 10, 2016

(54) MOTOR CONTROL CENTER UNITS INCLUDING AUXILIARY POWER INTERLOCK CIRCUITS AND METHODS OF OPERATING SAME

(71) Applicant: Eaton Corporation, Cleveland, OH (US)

(72) Inventors: James Allen Stoner, Greensburg, PA (US); Mark Francis Yerse, Hope Mills, NC (US); Robert Allan Morris, Fayetteville, NC (US)

(73) Assignee: Eaton Corporation, Cleveland, OH (US)

( * ) Notice: Subject to any disclaimer, the term of this patent is extended or adjusted under 35 U.S.C. 154(b) by 222 days.

(21) Appl. No.: 14/251,138

(22) Filed: Apr. 11, 2014

(65) Prior Publication Data

US 2015/0296639 A1 Oct. 15, 2015

(51) Int. Cl.
*H02B 11/133* (2006.01)
*H05K 5/02* (2006.01)
*H05K 7/14* (2006.01)
*H02B 1/36* (2006.01)

(52) U.S. Cl.
CPC ............... *H05K 5/0208* (2013.01); *H02B 1/36* (2013.01); *H05K 7/14* (2013.01); *H02B 11/133* (2013.01)

(58) Field of Classification Search
CPC .................................................. H02B 11/133
See application file for complete search history.

(56) References Cited

U.S. PATENT DOCUMENTS

| | | | |
|---|---|---|---|
| 4,024,441 A | 5/1977 | Coyle et al. | |
| 4,937,403 A | 6/1990 | Minoura et al. | |
| 7,684,199 B2 * | 3/2010 | Yee | H02B 1/36 361/608 |
| 7,688,572 B2 * | 3/2010 | Yee | H02B 1/36 200/50.08 |
| 7,800,888 B2 * | 9/2010 | Morris | H02B 1/36 361/601 |
| 7,965,493 B2 * | 6/2011 | Leeman | H02B 1/36 200/50.17 |
| 8,054,606 B2 * | 11/2011 | Morris | H01H 3/26 361/115 |
| 8,199,022 B2 * | 6/2012 | Morris | G01R 1/04 340/10.34 |
| 8,248,761 B2 * | 8/2012 | Leeman | H02B 1/36 200/50.08 |
| 8,305,736 B2 * | 11/2012 | Yee | H02B 1/36 200/50.22 |
| 8,537,518 B2 * | 9/2013 | Morris | H01H 3/26 200/308 |
| 8,817,454 B2 * | 8/2014 | Morris | F02D 11/02 200/50.11 |
| 2008/0022673 A1 | 1/2008 | Morris et al. | |
| 2013/0088812 A1 * | 4/2013 | Yee | H02B 1/36 361/609 |
| 2014/0211377 A1 * | 7/2014 | Graf | H02B 11/12 361/609 |
| 2014/0362498 A1 * | 12/2014 | Morris | F02D 11/02 361/624 |

OTHER PUBLICATIONS

International Search Report and Written Opinion from corresponding App. No. PCT/IB2015/052631; mailed Jun. 11, 2015 (8 pages).

* cited by examiner

*Primary Examiner* — Robert J Hoffberg
(74) *Attorney, Agent, or Firm* — Myers Bigel & Sibley, P.A.

(57) ABSTRACT

A motor control center (MCC) unit for installation in a compartment of an MCC includes a frame, a bus contact assembly supported by the frame and comprising at least one moveable bus contact configured to releasably engage at least one power bus of the MCC, an auxiliary power input supported by the frame and configured to be connected to an external power source, and a control circuit supported by the frame. The MCC unit further includes an interlock circuit configured to selectively couple the control circuit to the at least one bus contact and the auxiliary power input responsive to positioning of the at least one bus contact. The interlock circuit may be configured to prevent power flow between the control circuit and the auxiliary power input when the at least one bus contact is engaged with the power bus.

24 Claims, 10 Drawing Sheets

MOTOR CONTROL CENTER UNITS INCLUDING AUXILIARY POWER INTERLOCK CIRCUITS AND METHODS OF OPERATING SAME

FIELD OF THE INVENTION

The present invention relates to motor control center (MCC) units and, more particularly, to power distribution in MCC units.

BACKGROUND

A motor control center (MCCs) typically includes a cabinet or enclosure that is configured to hold "bucket" assemblies or units, which may be configured in a modular fashion, such as shown in U.S. Pat. No. 4,024,441. Such units may contain various motor control and motor protection components such as motor controllers, starters, contactor assemblies, overload relays, circuit breakers, motor circuit protectors, and other devices. The units may be configured to connect to power buses of the motor control center and control provision of power to motors or other devices.

Some MCC units may be configured such that, when installed in the MCC, bus contacts of the unit may be releasably engaged with the power buses of the MCC. This allows the MCC unit to be de-energized without removing the unit from the MCC. Such MCC units are described, for example, in U.S. Patent Application Publication No. 2008/0022673.

As noted above, MCC units typically include control circuitry that is used to control motors and other devices. Such control circuitry is often powered from the MCC buses via step-down transformers that convert from the MCC bus voltage (e.g., 480 VAC) to the control circuit voltage (e.g., 120 VAC). It is generally desirable to be able to test the operation of such control circuitry to, for example, assure proper operation upon installation, perform preventive maintenances and troubleshoot malfunctions. Such testing may be conducted in situ and/or at a test bench.

If testing is performed in situ, it is desirable to perform such testing with the MCC unit control circuitry disconnected from the MCC power buses. Some MCC units are configured to allow power to be provided to the MCC unit control circuitry from an external source to support testing of the control circuitry when that control circuitry is not powered by the MCC power bus. For example, the MCC unit control circuitry may be powered using a pigtail connection and/or by connecting an external power source to the MCC unit control circuitry using a power input socket. An MCC unit may include a control power transformer that has a primary connected to bus contact stabs of the MCC unit and a secondary that may be coupled to the control circuit power input socket using a jumper cable that must be unplugged in order to connect the control circuitry to an external power source, thus preventing connection of the external power source to the control power transformer and dangerous backfeed to the MCC bus. However, such techniques may require opening the door of the MCC compartment containing the MCC unit, creating a possibility that an operator may be exposed to the MCC bus voltage of the MCC bus and, thus, requiring the operator to don personal protection equipment (PPE) to meet safety requirements. Accordingly, there is a need for improved techniques for providing test power to MCC units.

SUMMARY

Some embodiments of the invention provide a motor control center (MCC) unit for installation in a compartment of an MCC. The MCC unit includes a frame, a bus contact assembly supported by the frame and comprising at least one moveable bus contact configured to releasably engage at least one power bus of the MCC, an auxiliary power input supported by the frame and configured to be connected to an external power source, and a control circuit supported by the frame. The MCC unit further includes an interlock circuit configured to selectively couple the control circuit to the at least one bus contact and the auxiliary power input responsive to positioning of the at least one bus contact. The interlock circuit may be configured to prevent power flow between the control circuit and the auxiliary power input when the at least one bus contact is engaged with the power bus.

In some embodiments, the interlock circuit may include a switch configured to couple and decouple the control circuit and the at least one bus contact responsive to positioning of the at least one bus contact. In further embodiments, the interlock circuit may include a switch configured to couple and decouple the control circuit and the auxiliary power input responsive to positioning of the at least one bus contact.

In some embodiments, the MCC unit may further include a circuit interruption device supported by the frame and configured to couple and decouple a load and the at least one bus contact. The interlock circuit may be configured to selectively couple the at least one bus contact and the auxiliary power input to the control circuit responsive to a state of the circuit interruption device. The interlock circuit may include at least one auxiliary contact set of the circuit interruption device. For example, the interlock circuit may include a first auxiliary contact set of the circuit interruption device configured to couple and decouple the control circuit and the at least one bus contact and a second auxiliary contact set of the circuit interruption device configured to couple and decouple the control circuit and the auxiliary power input.

In some embodiments, the interlock circuit may include a first relay contact set configured to couple and decouple the control circuit and the auxiliary power input and a second relay contact set configured to couple and decouple the control circuit and the at least one bus contact. The interlock circuit may further include at least one switch configured to operate the first and second relay contact sets responsive to positioning of the at least one bus contact.

In some embodiments, the auxiliary power input may include a power connector supported by the frame and configured to mate with a matching connector of a power cord. In some embodiments, the power connector may be accessible via an opening in a door of the MCC compartment. In some embodiments, the power connector may be accessible without opening the MCC compartment door. According to some embodiments, the MCC unit may include a device panel supported by the frame and having a plurality of user interface devices mounted thereon, and the power connector may be mounted on the device panel. In some embodiments. The MCC unit may further include a key switch configured to couple and decouple the auxiliary power input and the control circuit.

Further embodiments of the inventive subject matter provide an MCC unit including a frame, a bus contact assembly supported by the frame and comprising at least one moveable bus contact configured to selectively engage at least one power bus of the MCC, an auxiliary power input supported by the frame and configured to be connected to an external power source, and a control circuit supported by the frame. The MCC unit further includes an interlock circuit comprising at least one switch configured decouple the control circuit from the auxiliary power input when the at least one bus contact is engaged with the at least one power bus. The at least one switch may be mechanically actuated by a positioning of the at least one bus contact.

In some embodiments, the at least one switch may including at least one set of relay contacts and the interlock circuit may further include at least one mechanical switch configured to operate the at least one set of relay contacts responsive to positioning of the at least one bus contact.

In some embodiments, the at least one switch may include a first switch and the interlock circuit may further include a second switch configured to decouple the control circuit from the at least one bus contact when the at least one bus contact is disengaged from the power bus. The second switch may be mechanically actuated by a positioning of the at least one bus contact.

In further embodiments, the second switch may include a set of relay contacts and the interlock circuit may include a mechanical switch configured to operate the set of relay contacts responsive to positioning of the at least one bus contact. The set of relay contacts may further operate responsive to presence or absence of power at the auxiliary power input.

Additional embodiments provide methods including installing a MCC unit in a compartment of an MCC and, responsive to positioning of at least one moveable bus contact of the MCC unit, selectively coupling a control circuit to the at least one bus contact and an auxiliary power input of the MCC unit. The methods may further include decoupling the control circuit from the auxiliary power input responsive to engagement of the at least one bus contact with at least one power bus of the MCC. Engagement of the at least one bus contact with the at least one power bus may be detected using at least one mechanically actuated switch.

DETAILED DESCRIPTION

Figure 1:
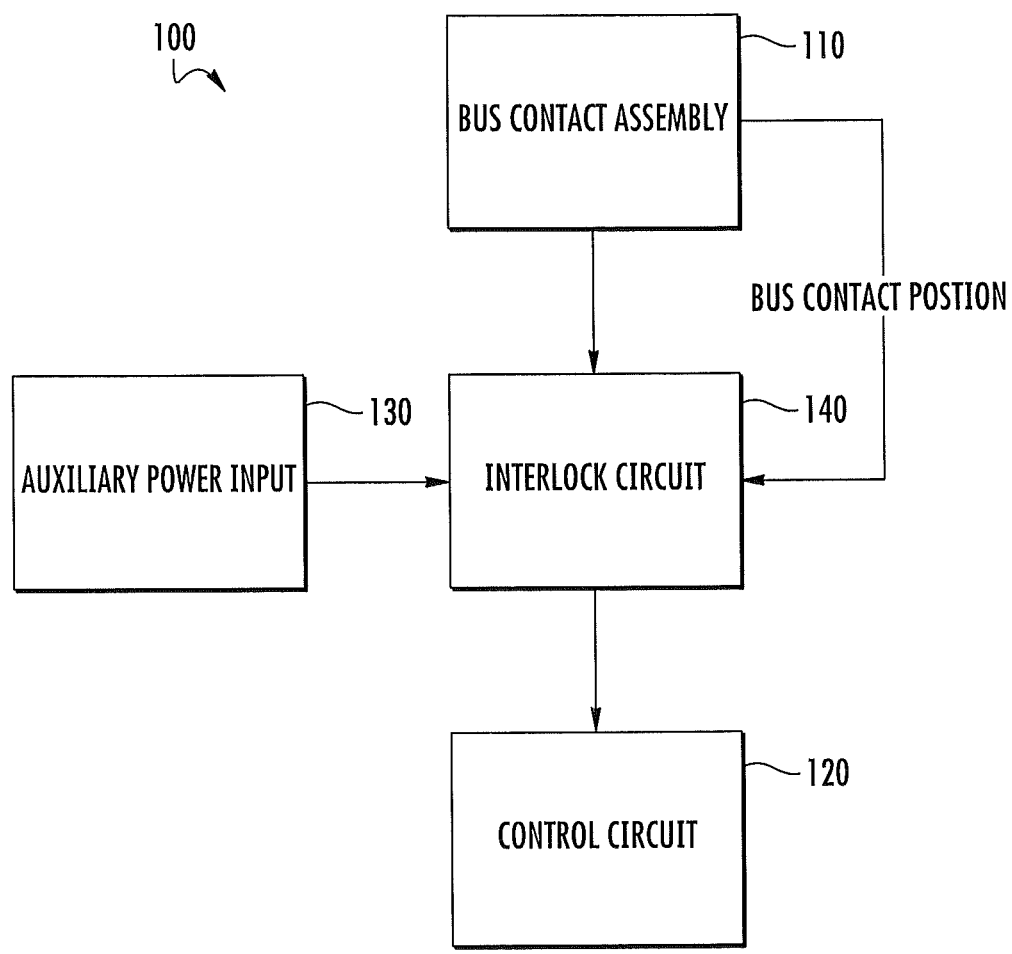
FIG. 1 is a schematic diagram illustrating an MCC unit according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

An MCC unit may be configured to be a removable modular unit capable of being installed in a compartment of an MCC. The unit may contain various motor control and motor protection components such as motor controllers, starters, contactor assemblies, overload relays, circuit breakers, motor circuit protectors, various disconnects, and similar devices for electric motors. The unit is configured to connect to a common power bus of the motor control center and conduct supply power to the line side of the motor control devices for operation of motors or feeder circuits.

The term "switch" is used to generally apply to devices that perform switching functions that selectively couple and decouple selected circuits responsive to mechanical and/or electrical inputs. Switches include mechanical switches, such as microswitches, pushbutton switches, rotary switches, and the like, as well as electrically-actuated switching devices, including, but not limited to, relays (electromechanical and solid-state), contactors, and circuit breakers. It will be appreciated that such devices include single-pole, single-throw, multi-pole and multi-throw devices.

FIG. 1 schematically illustrates an MCC unit 100 according to some embodiments of the inventive subject matter. The MCC unit 100 includes a moveable bus contact assembly 110, which includes one or more moveable bus contacts configured to releasably engage one or more power buses of an MCC in which the MCC unit 100 is installed. An interlock circuit 140 is configured to selectively couple the bus contact assembly 110 and an auxiliary power input 130 to a control circuit 120 (e.g., a motor controller, starter, circuit protector or the like) of the MCC unit 100 to supply power thereto. The interlock circuit 140 operates responsive to bus contact position info pertaining to the bus contact assembly 110. In particular, the interlock circuit 140 is configured to preventing provision of power from the auxiliary power input 130 to the control circuit 120 when the bus contact(s) are engaged with buses of the MCC. The interlock circuit 140 is further configured to allow power to be supplied to from the auxiliary power input 130 to the control circuit 120 when the bus contact(s) of the bus contact assembly 110 are disengaged. According to some aspects, the interlock circuit 140 may constrain power flow from the auxiliary power input 130 to the control circuit 120 only when the bus contact(s) are in a fully disengaged or "safe" position that reduces the likelihood of contact with one or more power buses of the MCC in which the MCC unit 100 is installed. As discussed below, the interlock circuit 140 may also constrain power flow to the control circuit 120 from the bus contact assembly 110 and/or the auxiliary power input 130 based on upon the status of other components of the MCC unit 100, such power disconnects and/or breakers.

It will be appreciated that the MCC unit 100 may be implemented in any of a number of different ways. For example, the bus contact assembly 110 may use any of a number of different types of mechanisms to engage and disengage bus contacts from the MCC buses, including, but not limited to, mechanisms such as those described in the aforementioned U.S. Patent Application Publication No. 2008/0022673, the contents of which are incorporated herein by reference in their entirety. Bus contact position information used by the interlock circuit 140 may be obtained using, for example, mechanical microswitches, position transducers and the like. As described below, the interlock circuit 140 may include any of a variety of different devices to provide the interlock functions described herein, including, but not limited to switches, relays and the like.

Figure 2:
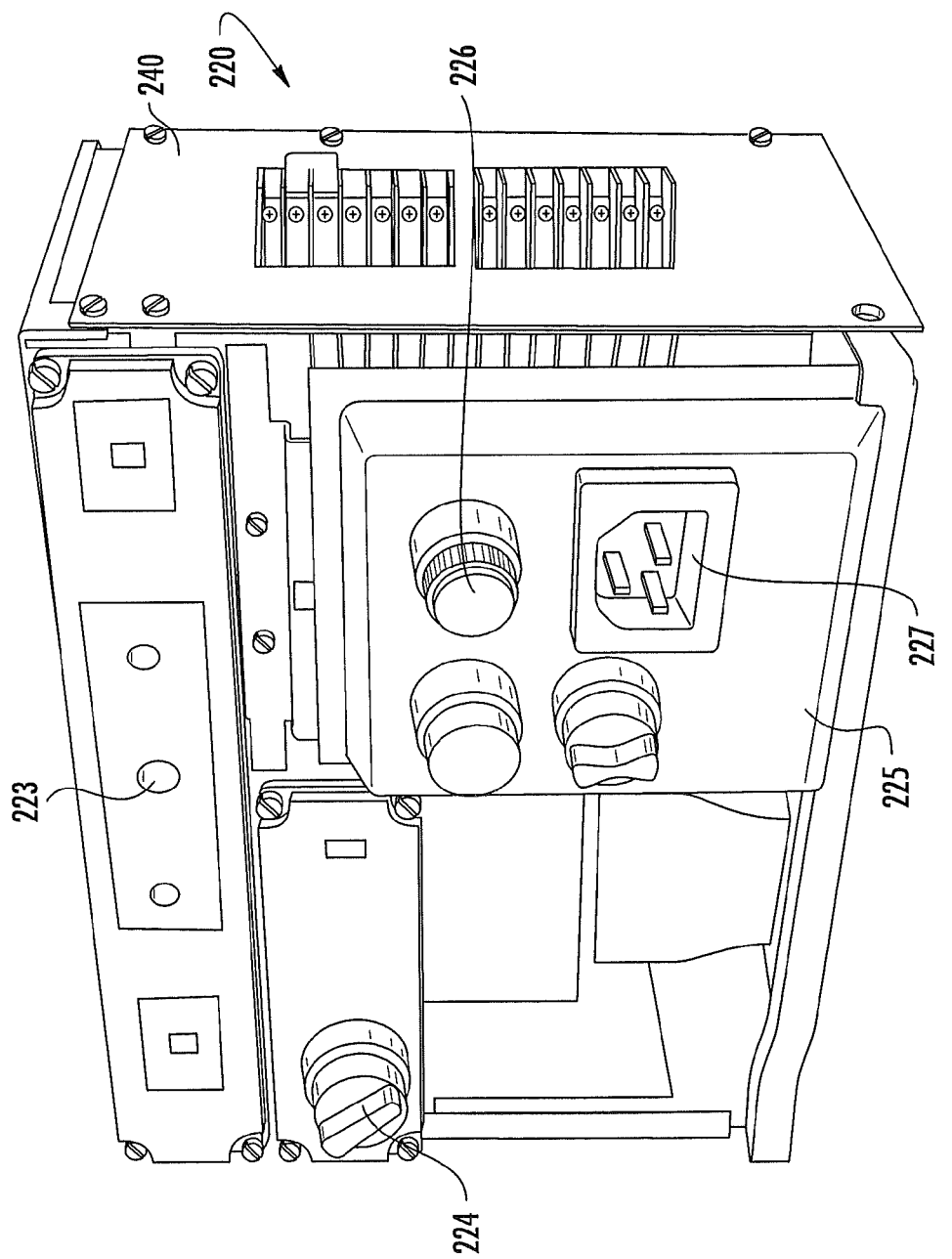
FIG. 2 is a perspective view of an MCC unit in relation to an MCC door according to further embodiments.
Figure 3:
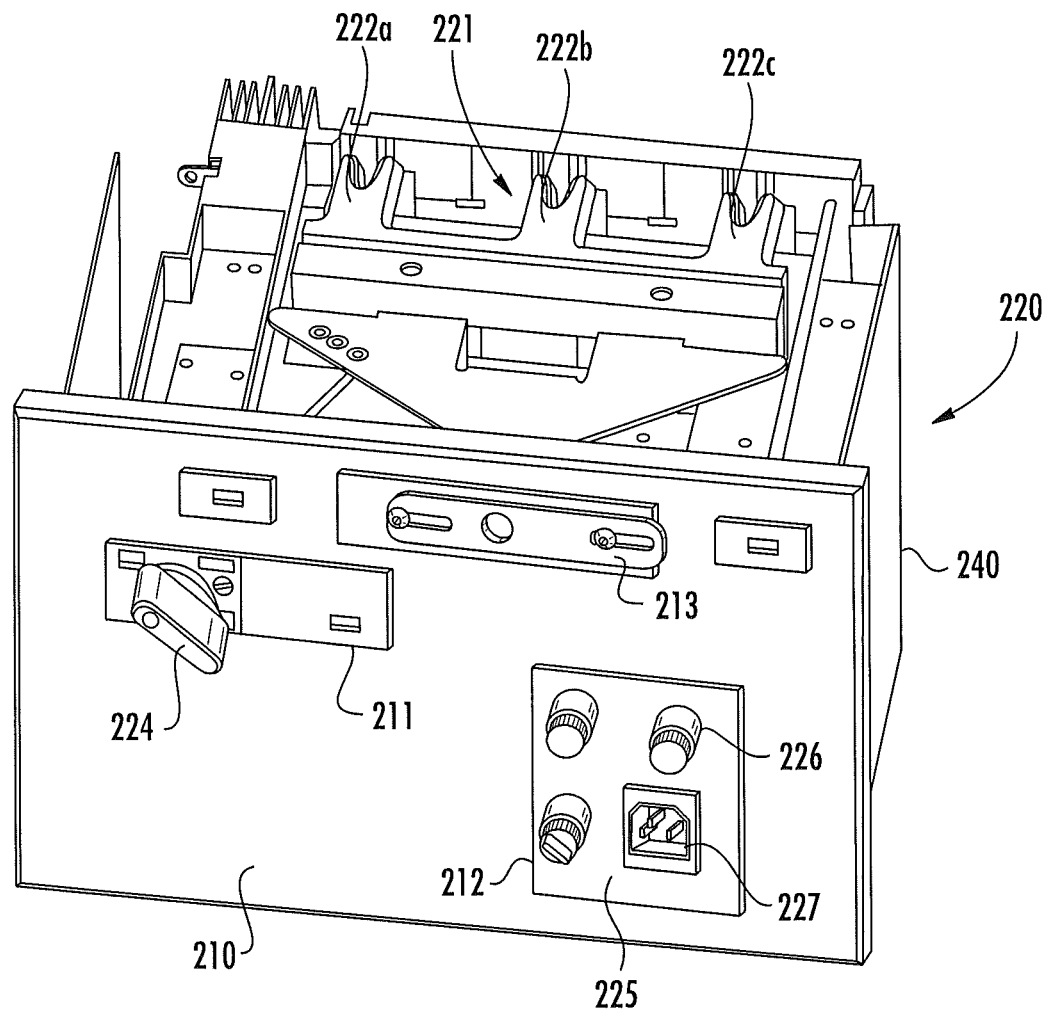
FIG. 3 is a perspective view of the MCC unit of FIG. 1.

FIG. 2 illustrates an MCC unit 220 according to some embodiments, and FIG. 3 illustrates the MCC unit 220 in relation to a door 210 of a compartment of an MCC in which the MCC unit 220 is installed (other features of the MCC are not illustrated for purposes of simplicity of illustration). The MCC unit 220 includes a frame 240 that is configured to be inserted or otherwise installed in a compartment of an MCC. The frame 240 may includes any of a variety of different housing and/or structural support components and may be formed from any of a variety of different materials (e.g., metal, composites, thermoplastics, and the like).

The frame 240 supports a moveable bus contact mechanism 221 including bus contacts 222*a*, 222*b*, 222*c* that are configured to extend and retract to contact and disengage, respectively, from buses of the MCC. In the illustrated embodiments, the moveable bus contact mechanism 221 may be actuated using a tool inserted in a drive socket 223 accessible through an opening 213 in the door 210, but it will be appreciated that other mechanisms may be used. As illustrated, the MCC unit 220 further includes a disconnect 224 having a handle configured to extend through an opening 211 in the door 210. The handle may facilitate manual circuit closure and interruption, and the disconnect 224 may further provide automatic circuit interruption (circuit breaker) operations in response to events such as overcurrent conditions, arc faults, and ground faults. The MCC unit 220 further includes a device panel 225 accessible through an opening 212 in the door 210, and upon which various switches 226 (e.g., motor start/stop switches) are mounted. As further shown, the MCC unit 220 includes an auxiliary power input in the form of a socket 227 mounted on the device panel 225.

Figure 4:
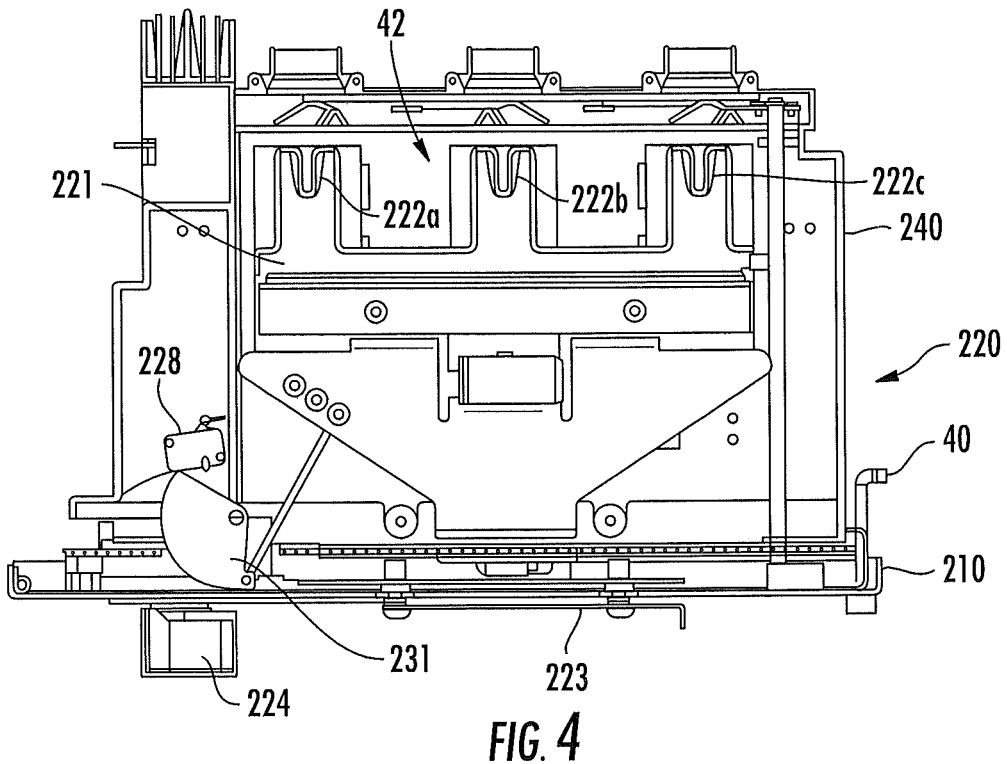
FIGS. 4-8 are top and bottom views of an MCC unit illustrating movement of a bus contact assembly and actuation of bus contact position switches in response thereto according to some embodiments.
Figure 5:
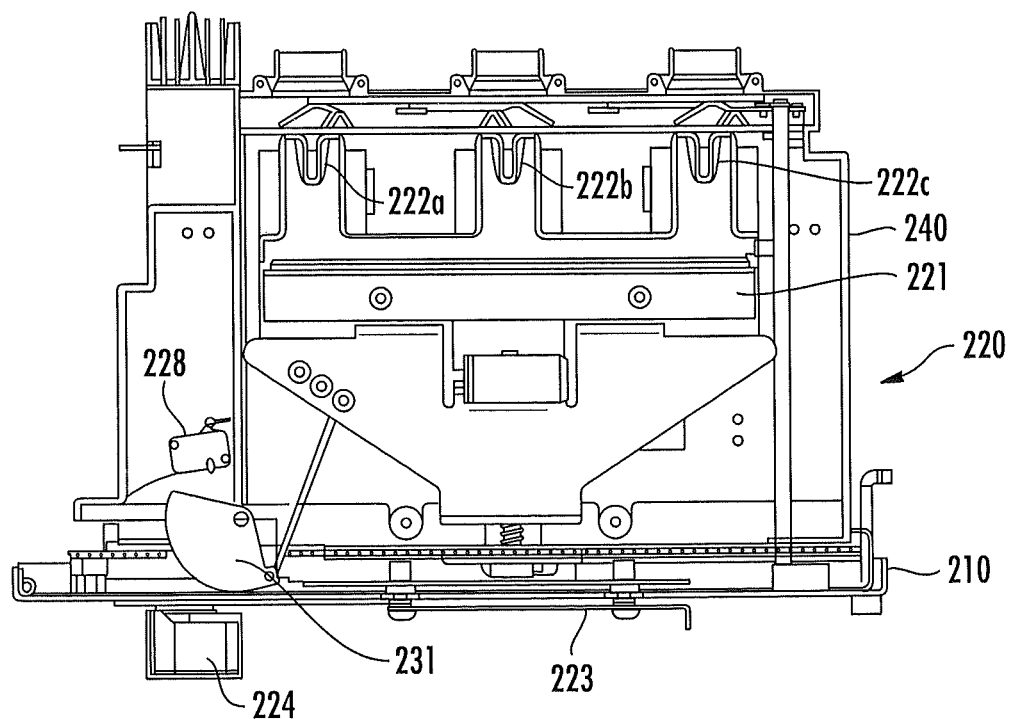
Figure 6:
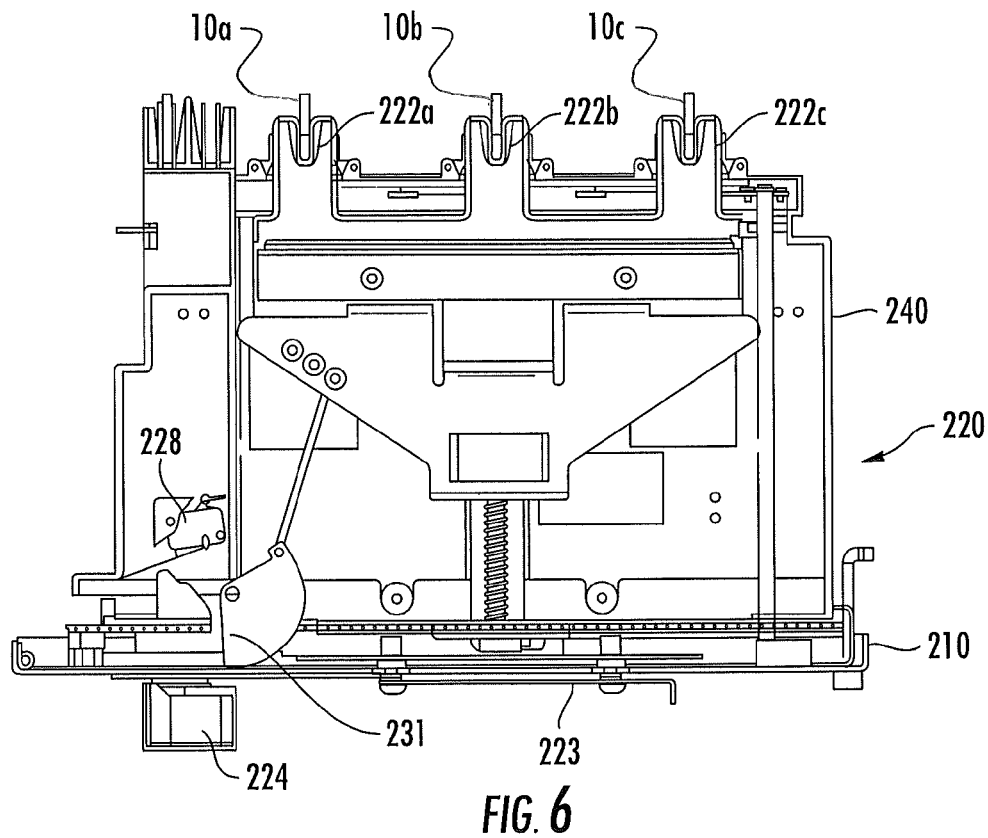

FIGS. 4-6 are top views of the MCC unit 220 illustration operation of the moveable bus contact mechanism 221. Positioning of the bus contact mechanism 221 may be detected by a microswitch 228 that is configured to engage a cam 231 that is operably coupled to the mechanism 221. In particular, FIG. 4 illustrates the mechanism 221 in a position in which bus contacts 222*a*, 222*b*, 222*c* are fully retracted in a "safe" position in which they are shielded from the MCC buses by a shutter mechanism, as described in the aforementioned U.S. Patent Application Publication No. 2008/0022763. In this position, the cam 231 engages the microswitch 228 to place contacts thereof in a first state. Referring to FIG. 5, as the bus contacts 222*a*, 222*b*, 222*c* are extended from the fully retracted position, the cam 231 disengages from the microswitch 228, thus changing the state of its contacts. FIG. 6 illustrates the bus contacts 222*a*, 222*b*, 222*c* in a fully extended position in which they engage respective buses 10*a*, 10*b*, 10*c* of an MCC. Thus, microswitch 228 may be used to provide a positive indication of a state in which the bus contacts 222*a*, 222*b*, 222*c* are fully retracted and, thus, protected from contact with the buses 10*a*, 10*b*, 10*c*.

Figure 7:
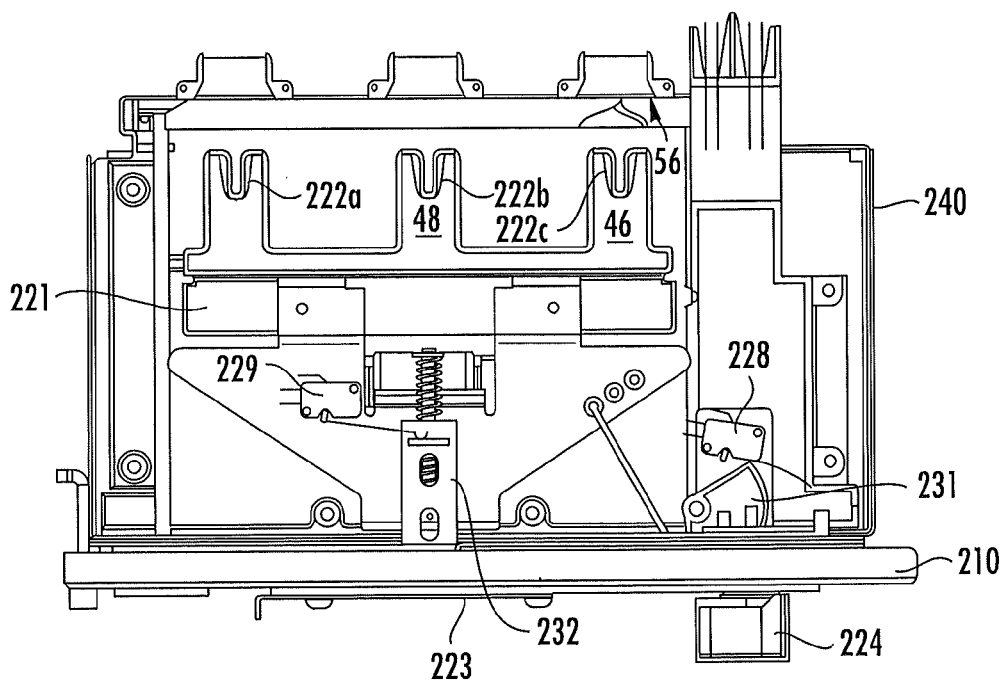
Figure 8:
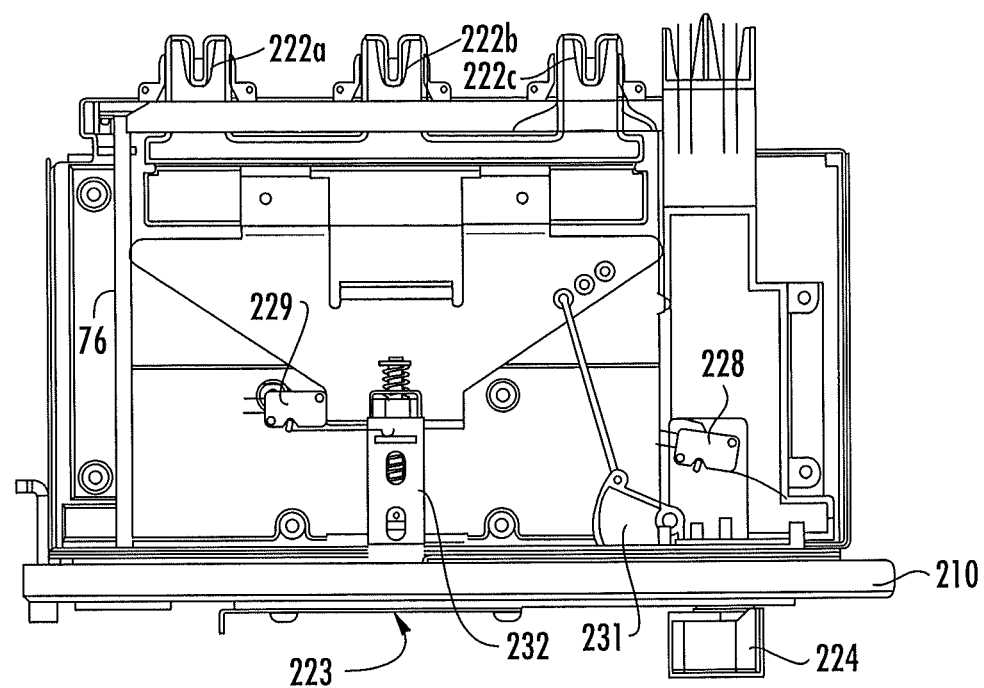

FIGS. 7 and 8 are bottom views of the MCC unit 220, showing a second microswitch 229 that may be used to provide a positive indication of when the bus contacts 222*a*, 222*b*, 222*c* are fully extended and, thus, in contact with the buses 10*a*, 10*b*, 10*c*. In particular, the body of the microswitch 229 may be fixed to the frame 240 and be actuated by contact with a member 232 that moves with the contacts 222*a*, 222*b*, 222*c*. It will be appreciated that the position detecting mechanisms shown in FIGS. 4-8 are provided for purposes of illustration, and that any of a variety of other mechanisms may be used to indicate bus contact states in other embodiments.

FIGS. 9-12 are schematic diagrams illustrating various interlock circuit arrangements according to embodiments of the inventive subject matter which may use position switches, such as the mechanical microswitches 228, 229 shown in FIGS. 4-8. The illustrated embodiments may also incorporate other interlock features, such breaker contact arrangements and relays.

Figure 9:
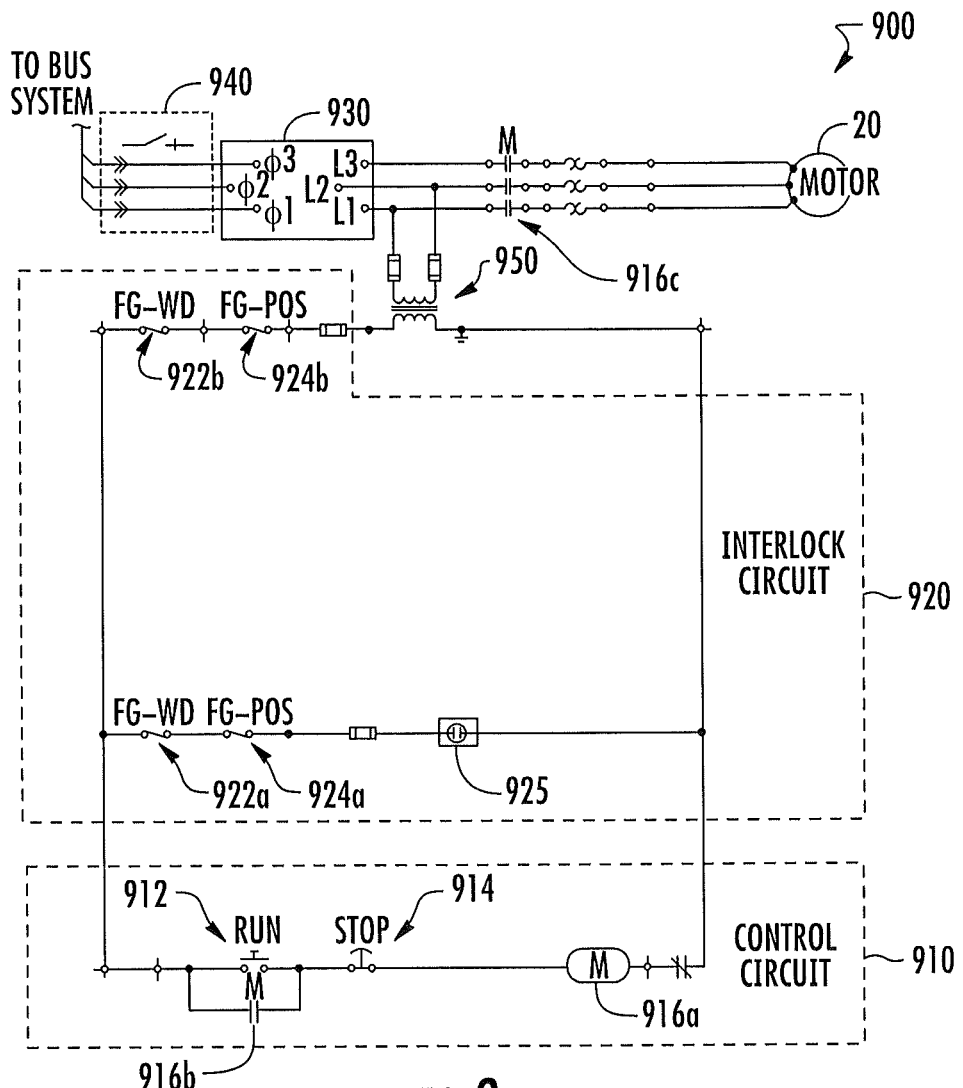
FIG. 9 is a schematic diagram illustrating an MCC unit with an interlock circuit incorporating bus contact position switches according to further embodiments.

Referring to FIG. 9, an MCC unit 900 according to some embodiments includes a bus contact assembly 940 which is configured to releasably engage power buses of an MCC. The MCC unit 900 further includes a disconnect 930, which is configured to selectively couple power conductors of the bus contact assembly 940 to an external load, here shown as a motor 20, via contacts 916*c* of a motor start relay M that has a coil 916*a* that is selectively energized by a control circuit 910 responsive to user inputs. As shown, the control circuit 910 may comprise, for example, a motor starter circuit including a run switch 912, a stop switch 914 and another contact 916*b* of the motor start relay M. It will be appreciated that this example of a control circuit 910 is provided for purposes of illustration, and that other types of control circuits may be used in various embodiments of the inventive subject matter.

The control circuit 910 receives power from an interlock circuit 920. The interlock circuit 920 is coupled to the output of the disconnect 930 via a step-down control power transformer 950 and from an auxiliary power input in the form of a power socket 925 configured to mate with a connector of a power cord (e.g., the socket 227 of FIGS. 1 and 2). The secondary of the transformer 950 and the power socket 925 are selectively coupled to the control circuit 910 by a network of switches that operate responsive to positioning of the bus contacts of the bus contact assembly 940.

The switches include a first multipole position switch FG-WD (e.g., corresponding to the switch 228 of FIGS. 4-6) including first and second contact sets 922*a*, 922*b*. When the bus contacts of the bus contact assembly 940 are in a fully withdrawn position (e.g., the "safe" position indicated in FIGS. 4 and 7), the first set of contacts 922*a* is closed and the second set of contacts 922*b* is open, thus preventing closing of the circuit between the secondary of the transformer 950 and the control circuit 910. When the bus contacts are in any position other than the fully withdrawn position, however, the second set of contacts 922b is closed and first set of contact 922a is open, thus preventing closing of the circuit between the auxiliary power input 925 and the control circuit 910 when there is an increased chance of exposure to the MCC buses.

The interlock circuit 140 further includes a second multipole switch FG-POS (e.g., corresponding to switch 229 of FIGS. 7 and 8) including first and contact sets 924a, 924b. When the bus contacts of the bus contact assembly 940 are fully engaged (e.g., contacts fully extended as shown in FIGS. 6 and 8), the first set of contacts 924a is open and the second set of contacts 924b is closed, thus allowing closure of the circuit between the secondary of the transformer 950 and the control circuit 910 while preventing closure of the circuit between the auxiliary power input 925 and the control circuit 910. When the bus contacts are in any other than the fully extended position, however, the second set of contacts 924b opens and the first set of contacts 924a closes, thus allowing the circuit between the auxiliary power input 925 and the control circuit 910 to close under control of the first switch FG-WD. Thus, an effect of the interlock circuit 140 is to allow power to flow from the bus contact assembly 940 to the control circuit 910 only if the bus contacts of the bus contact assembly 940 are fully engaged and to allow power to flow from the auxiliary power input 925 to the control circuit 910 only if the bus contacts are in a fully withdrawn "safe" position.

Figure 10:
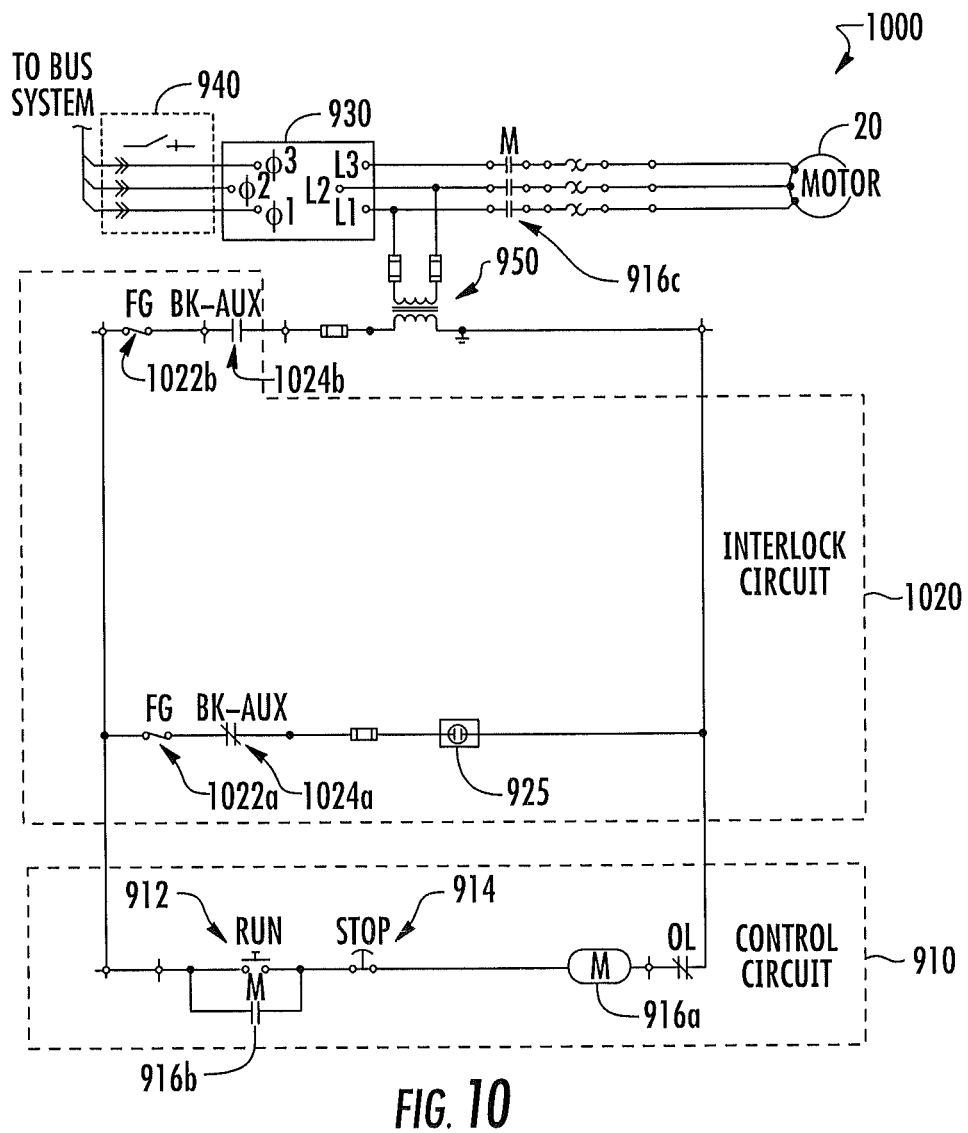
FIG. 10 is a schematic diagram illustrating an MCC unit with an interlock circuit incorporating bus contact position switches and circuit breaker auxiliary contacts according to further embodiments.

In some embodiments, an MCC unit may use position switches to similar effect in combination with an interlock relay that operates responsive to a status of a breaker included in the MCC unit. Referring to FIG. 10, an MCC unit 1000 includes a bus contact assembly 940, a disconnect 930, a step-down control power transformer 950 and a control circuit 910 as illustrated in FIG. 9. An interlock circuit 1020 includes a multipole switch FG with first and second contact sets 1022a, 1022b. When the bus contacts of the bus contact assembly 940 are fully engaged with buses of an MCC, the second set of contacts 1022b is closed and the first set of contacts 1022a is open, preventing closure of a circuit between an auxiliary power input 925 and the control circuit 910, while allowing closure of a circuit between the secondary of the transformer 950 and the control circuit 910. When the bus contacts are in any other position, the first set of contacts 1022a closes and the second set of contacts 1022b opens, preventing closure of the circuit between the secondary of the transformer 950 and the control circuit.

The interlock circuit 1020 further includes first and second breaker auxiliary contact sets 1024a, 1024b of the disconnect 930. If the bus contacts of the bus contact assembly 940 are fully engaged and the breaker is "on" (untripped), the second set of contacts 1024b is closed and power may flow from the transformer 950 to the control circuit 910. The first set of contacts 1024a is open, preventing closing of the circuit between the auxiliary power input 925 and the control circuit 910. If the bus contacts are engaged, but the breaker is tripped, the second set of contacts 1024b is open and prevents such power transfer. In this state, the first set of contacts 1024a closes, but closure of the circuit between the auxiliary power input 925 and the control circuit 910 is dependent upon the position of the bus contact assembly 940. If the bus contacts are not engaged with the MCC buses, power can flow from the auxiliary power input 925 to the control circuit 910, as the opening of the second set of breaker contacts 1024b prevents backfeed to the secondary of the transformer 950. The effect of the interlock circuit 1020 is to prevent power flow from the auxiliary power input 925 to the control circuit 910 when the bus contacts are engaged and to otherwise allow such power flow as long as the breaker BK is open.

Figure 11:
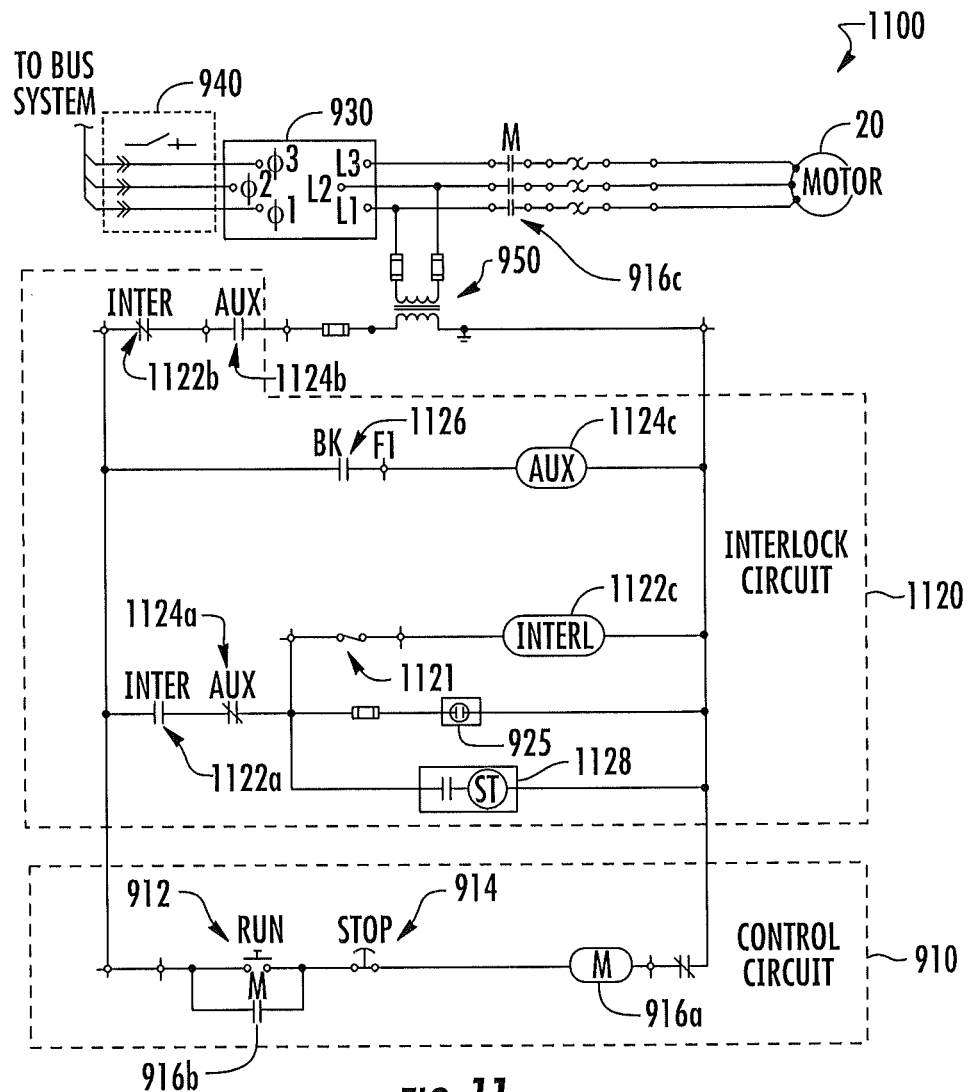
FIG. 11 is a schematic diagram illustrating an MCC unit with an interlock circuit incorporating a bus contact position switch and interlock relays according to further embodiments.

FIG. 11 schematically illustrates an MCC unit 110 according to further embodiments. The MCC unit 1100 includes a bus contact assembly 940, a disconnect 930, a step-down control power transformer 950 and a control circuit 910 as illustrated in FIGS. 9 and 10. An interlock circuit 1120 includes a first multipole relay INTER including first and second sets of contacts 1122a, 1122b and a coil 1122c and a second multipole relay AUX including first and second sets of contacts 1124a, 1124b and a coil 1124c. The coil 1122a of the first relay INTER is selectively energized by a position switch 1121 that operates responsive to presence of an auxiliary power source at an auxiliary power input 925 and positioning of the bus contacts of the bus contact assembly 940. When the bus contacts are in a fully engaged position, the switch 1121 opens, preventing energization of the relay coil 1122c and placing the first set of relay contacts 1122a in an open state. This prevents closing of a circuit between an auxiliary power input 925 and the control circuit 910. The second set of contacts 1122b is closed. If the bus contacts are not fully engaged and the auxiliary power source is present at the auxiliary power input 925, the coil 1122c is energized, closing the first set of contacts 1122a and opening the second set of contacts 1122b, preventing power flow from the transformer 950 to the control circuit 910.

The state of the second relay AUX is determined by the state of a set of auxiliary contacts 1126 of the disconnect breaker 930. If the disconnect 930 is "off" (tripped or turned off), the set of auxiliary contacts 1126 is open and energization of the coil 1124c of the relay AUX is prevented. This causes the first set of contacts 1124a to be open, permitting closure of the circuit between the auxiliary power input 925 and the control circuit 910 under control of the first relay INTER. As shown, a shunt trip mechanism 1128 may be configured to trip the breaker in the presence of power at auxiliary power input 925. It will be appreciated that the breaker may be reset manually.

Figure 12:
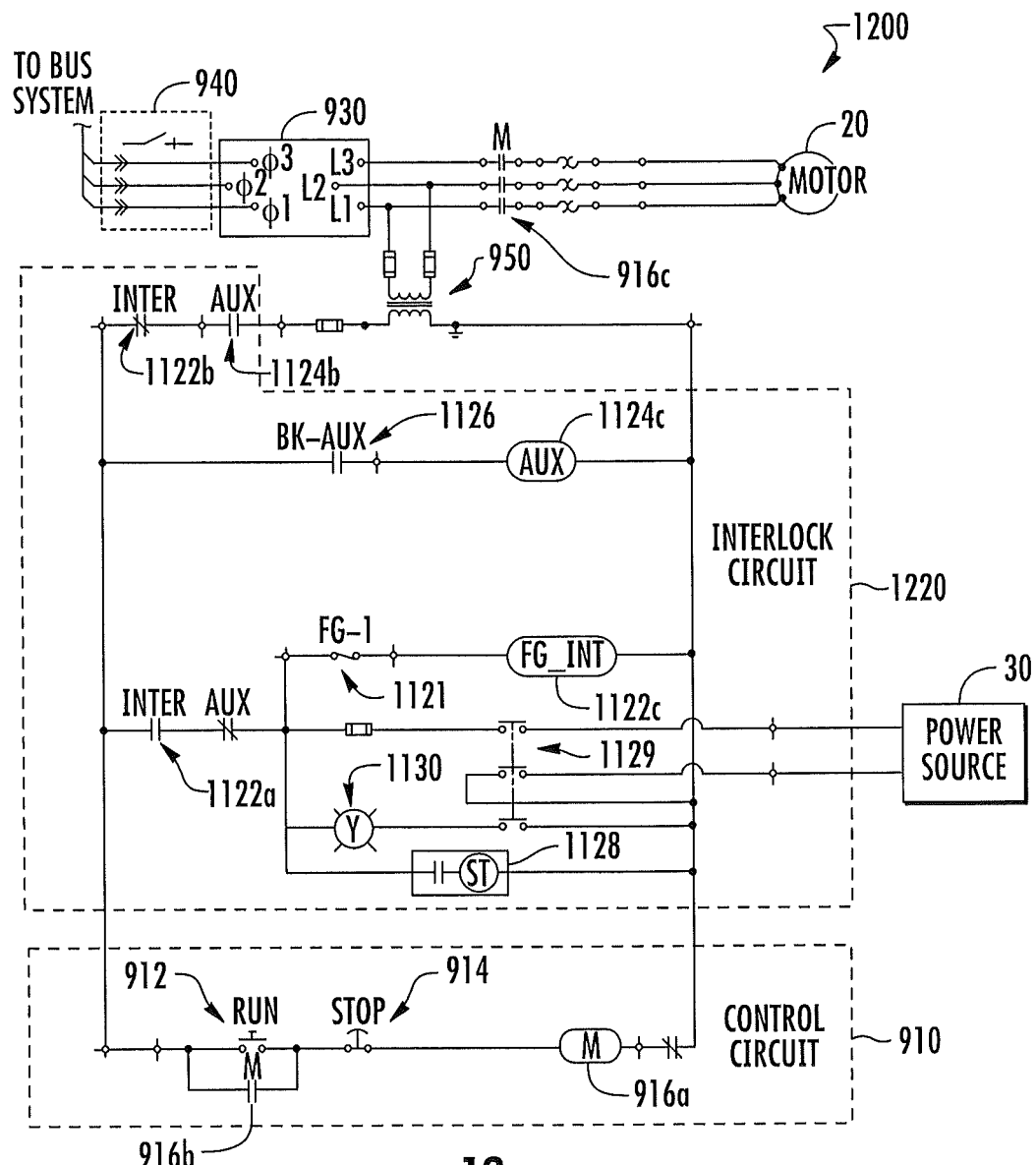
FIG. 12 is a schematic diagram illustrating an MCC unit with an interlock circuit incorporating a bus contact position switch, interlock relays and a key switch for an external auxiliary power supply according to further embodiments.

According to further embodiments, auxiliary power may be provided to an MCC unit in a number of different ways. For example, FIG. 12 illustrates an MCC unit 1200 substantially the same as the MCC unit 1100 of FIG. 11, except that auxiliary power is provided via a keyed switch 1129 that is coupled to an auxiliary power source 30. The power source 30 may include, for example, a source external to the MCC in which the MCC unit 1200 is installed (for in situ testing), another bucket installed in the MCC, or a bench source.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed is:
1. A motor control center (MCC) unit for installation in a compartment of an MCC, the MCC unit comprising:
  a frame;
  a bus contact assembly supported by the frame and comprising at least one moveable bus contact configured to releasably engage at least one power bus of the MCC;
  an auxiliary power input supported by the frame and configured to be connected to an external power source;
  a control circuit supported by the frame; and an interlock circuit configured to selectively couple:
when the at least one bus contact is in a first position, the control circuit is coupled to the at least one bus contact and the control circuit is decoupled from the auxiliary power input; and
when the at least one bus contact is in a second position, the control circuit is coupled to the auxiliary power input and the control circuit is decoupled from the at least one bus contact, the first position being different than the second position.

2. The MCC unit of claim 1, wherein the interlock circuit is configure to prevent power flow between the control circuit and the auxiliary power input when the at least one bus contact is in a first position and engaged with the at least one power bus.

3. The MCC unit of claim 1, wherein the interlock circuit comprises at least one switch configured to couple and decouple the control circuit and the at least one bus contact responsive to positioning of the at least one bus contact.

4. The MCC unit of claim 1, wherein the interlock circuit comprises at least one switch configured to couple and decouple the control circuit and the auxiliary power input responsive to positioning of the at least one bus contact.

5. The MCC unit of claim 1, further comprising a circuit interruption device supported by the frame and configured to couple and decouple a load and the at least one bus contact, wherein the interlock circuit is configured to selectively couple only one of the at least one bus contact to the control circuit or the auxiliary power input to the control circuit responsive to a state of the circuit interruption device.

6. The MCC unit of claim 5, wherein the interlock circuit comprises at least one auxiliary contact set of the circuit interruption device.

7. The MCC unit of claim 6, wherein the at least one auxiliary contact set comprises a first auxiliary contact set of the circuit interruption device configured to couple and decouple the control circuit and the at least one bus contact, and a second auxiliary contact set of the circuit interruption device configured to couple and decouple the control circuit and the auxiliary power input.

8. The MCC unit of claim 1, wherein the interlock circuit comprises a first relay contact set configured to couple and decouple the control circuit and the auxiliary power input, and a second relay contact set configured to couple and decouple the control circuit and the at least one bus contact.

9. The MCC unit of claim 8, wherein the interlock circuit further comprises at least one switch configured to operate the first and second relay contact sets responsive to a positioning of the at least one bus contact.

10. The MCC unit of claim 1, wherein the auxiliary power input comprises a power connector supported by the frame and configured to mate with a matching connector of a power cord.

11. The MCC unit of claim 10, wherein the power connector is accessible via an opening in a door of the MCC compartment.

12. The MCC unit of claim 10, wherein the power connector is accessible without opening the door of the MCC compartment.

13. The MCC unit of claim 10, further comprising a device panel supported by the frame and having a plurality of user interface devices mounted thereon, wherein the power connector is mounted on the device panel.

14. The MCC unit of claim 1, the interlock circuit comprises a key switch configured to couple and decouple the auxiliary power input and the control circuit in combination with positioning of the at least one bus contact.

15. An MCC unit for installation in a compartment of an MCC, the MCC unit comprising:
a frame;
a bus contact assembly supported by the frame and comprising at least one moveable bus contact configured to selectively engage at least one power bus of the MCC;
an auxiliary power input supported by the frame and configured to be connected to an external power source;
a control circuit supported by the frame; and
an interlock circuit comprising at least one switch configured to decouple the control circuit from the auxiliary power input when the at least one bus contact is engaged with the at least one power bus.

16. The MCC unit of claim 15, wherein the at least one switch is mechanically actuated by a positioning of the at least one bus contact.

17. The MCC unit of claim 15, wherein the at least one switch comprises at least one set of relay contacts, and wherein the interlock circuit further comprises a mechanical switch configured to operate the at least one set of relay contacts responsive to positioning of the at least one bus contact.

18. The MCC unit of claim 15, wherein the at least one switch comprises a first switch configured to decouple the control circuit from the at least one bus contact when the at least one bus contact is disengaged from the at least one power bus, and a second switch configured to couple the control circuit to the auxiliary power input after the control circuit is decoupled from the at least one bus contact.

19. The MCC unit of claim 18, wherein the second switch is mechanically actuated by a positioning of the at least one bus contact.

20. The MCC unit of claim 18, wherein the second switch comprises at least one set of relay contacts and wherein the interlock circuit comprises at least one mechanical switch configured to operate the at least one set of relay contacts responsive to positioning of the at least one bus contact.

21. The MCC unit of claim 20, wherein the at least one set of relay contacts further operates responsive to presence or absence of power at the auxiliary power input.

22. A method comprising: installing a MCC unit in a compartment of an MCC; and
responsive to positioning of at least one moveable bus contact of the MCC unit, selectively coupling:
when the at least one bus contact is in a first position, a control circuit of the MCC unit is coupled to the at least one bus contact and the control circuit is decoupled from an auxiliary power input of the MCC unit; and
when the at least one bus contact is in a second position, the control circuit is coupled to the auxiliary power input and the control circuit is decoupled from the at least one bus contact, the first position being different than the second position.

23. The method of claim 22, wherein the decoupling the control circuit from the auxiliary power input is responsive to an engagement of the at least one bus contact with at least one power bus of the MCC in the first position.

24. The method of claim 23, further comprising detecting the engagement of the at least one bus contact with the at least one power bus in the first position using at least one mechanically actuated switch.

* * * * *